United States Patent
Barthelemy

(10) Patent No.: US 9,275,893 B2
(45) Date of Patent: Mar. 1, 2016

(54) METHOD OF DETACHING A LAYER

(71) Applicant: Soitec, Crolles (FR)

(72) Inventor: Alexandre Barthelemy, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 14/426,509

(22) PCT Filed: Apr. 10, 2013

(86) PCT No.: PCT/IB2013/000653
§ 371 (c)(1),
(2) Date: Mar. 6, 2015

(87) PCT Pub. No.: WO2014/037769
PCT Pub. Date: Mar. 13, 2014

(65) Prior Publication Data
US 2015/0243551 A1  Aug. 27, 2015

(30) Foreign Application Priority Data

Sep. 10, 2012  (FR) ...................... 12 02437

(51) Int. Cl.
*H01L 21/762* (2006.01)
(52) U.S. Cl.
CPC .... *H01L 21/76259* (2013.01); *H01L 21/76254* (2013.01)
(58) Field of Classification Search
CPC .................... H01L 21/76259; H01L 21/76254
USPC ........................................................ 438/458
See application file for complete search history.

(56) References Cited

U.S. PATENT DOCUMENTS

| | | | | |
|---|---|---|---|---|
| 6,613,678 B1* | 9/2003 | Sakaguchi | ........ | H01L 21/76254 257/E21.122 |
| 8,216,917 B2* | 7/2012 | Maleville | .......... | H01L 21/02079 257/E21.568 |
| 8,324,072 B2* | 12/2012 | Veytizou | ........... | H01L 21/76254 257/E21.561 |
| 8,497,190 B2* | 7/2013 | Landru | ............ | H01L 21/76243 257/E21.023 |
| 8,563,399 B2* | 10/2013 | Bruel | ................ | H01L 21/76254 438/162 |
| 8,614,501 B2* | 12/2013 | Landru | ............ | H01L 21/76243 257/1 |
| 8,623,740 B2* | 1/2014 | Landru | ............ | H01L 21/76251 257/E21.568 |
| 8,628,674 B2* | 1/2014 | Zussy | ............... | H01L 21/76251 216/36 |

(Continued)

OTHER PUBLICATIONS

Kim et al., Fabrication of Dislocation-Free Si Films Under Uniaxial Tension on Porous Si Compliant Substrates, Thin Sold Films, vol. 516, (2008), pp. 7599-7603.

(Continued)

*Primary Examiner* — Matthew Landau
*Assistant Examiner* — Grant Withers
(74) *Attorney, Agent, or Firm* — TraskBritt

(57) ABSTRACT

The present disclosure concerns a method of detaching a layer to be detached from a donor substrate, comprising the following steps: a) assembling the donor substrate and a porous substrate, b) application of a treatment of chemical modification of the crystallites, the chemical modification being adapted to generate a variation of the volume of the crystallites, the volume variation generates deformation in compression or in tension of the porous substrate, the deformation in compression or in tension generates a stress in tension or in compression in the donor substrate, which causes fracture in a fracture plane, the fracture plane delimiting the layer to be detached, the stress leading to the detachment of the layer to be detached from the donor substrate.

20 Claims, 3 Drawing Sheets

(56) References Cited

U.S. PATENT DOCUMENTS

| | | | |
|---|---|---|---|
| 2003/0087503 A1 | 5/2003 | Sakaguchi et al. | |
| 2003/0190794 A1* | 10/2003 | Ohmi | H01L 21/2007 438/458 |
| 2004/0058555 A1* | 3/2004 | Moriceau | H01L 21/26506 438/736 |
| 2004/0259326 A1* | 12/2004 | Hideo | G02F 1/136277 438/458 |
| 2007/0249140 A1 | 10/2007 | Dross et al. | |
| 2010/0081254 A1 | 4/2010 | Shimomura et al. | |
| 2012/0088351 A1 | 4/2012 | Tauzin et al. | |
| 2013/0196483 A1* | 8/2013 | Dennard | H01L 29/78603 438/458 |
| 2013/0294038 A1* | 11/2013 | Landru | H01L 21/76254 361/748 |
| 2014/0038392 A1* | 2/2014 | Yonehara | H01L 21/304 438/463 |
| 2014/0326416 A1* | 11/2014 | Landru | H01L 21/76251 156/712 |
| 2014/0339681 A1* | 11/2014 | Figuet | H01L 21/76254 257/618 |
| 2015/0118764 A1* | 4/2015 | Schwarzenbach | H01L 22/20 438/5 |
| 2015/0132923 A1* | 5/2015 | Gaudin | H01L 21/76251 438/459 |

OTHER PUBLICATIONS

International Search Report for International Application No. PCT/IB2013/000653 mailed Jun. 17, 2013, 4 pages.

* cited by examiner

METHOD OF DETACHING A LAYER

CROSS-REFERENCE TO RELATED APPLICATIONS

This application is a national phase entry under 35 U.S.C. §371 of International Patent Application PCT/IB2013/000653, filed Apr. 10, 2013, designating the United States of America and published in English as International Patent Publication WO 2014/037769 A1 on Mar. 13, 2014, which claims the benefit under Article 8 of the Patent Cooperation Treaty and under 35 U.S.C. §119(e) to French Patent Application Serial No. 1202437, filed Sep. 10, 2012, the disclosure of each of which is hereby incorporated herein in its entirety by this reference.

TECHNICAL FIELD

This disclosure concerns a method for detaching a layer from a donor substrate on a receiver substrate.

BACKGROUND

A known prior art technique for detecting a layer 2 to be detached from a donor substrate 1 and described in U.S. Patent Publication US 2007/0249140 (A1) and shown in FIG. 1, is a method of detaching a layer 2 to be detached from a donor substrate 1, comprising the following steps:
  a0) deposition of a metal layer 3 on the donor substrate 1 at a temperature greater than 750° C.,
  b0) cooling to room temperature the combination of the donor substrate 1 and the metal layer 3, the cooling causing, by virtue of a difference in the coefficient of thermal expansion, deformation in compression or in tension of the metal layer 3, the deformation of the layer 3 generating a stress in compression or in tension in the donor substrate 1. This stress causes fracture on a fracture plane 4, the fracture plane 4 delimiting the layer 2 to be detached, the stress leading to the detachment of the layer 2 to be detached from the donor substrate 1 on the fracture plane 4.

After the step a0), a cooling step b0) is applied to the donor substrate 1 covered by the metal layer 3. Cooling leads to the occurrence of a cleaving stress in the donor substrate 1 linked to the difference in the coefficient of thermal expansion between the metal layer 3 and the donor substrate 1.

However, the deposition of a metal layer 3 on the donor substrate 1 risks contamination of the layer 2 to be detached, which compromises the operation of the device fabricated from this layer.

Moreover, the thickness of the layer 2 to be detached depends on the cleavage stress exerted by the metal layer 3. As a result of this, the range of available thicknesses of the layer 2 to be detached is necessarily limited by the characteristics of the available metals.

Furthermore, a detachment method involving differences in the coefficient of thermal expansion that are too low necessitates process temperatures that are too high.

The disclosure, therefore, proposes a method of detaching a layer 2 to be detached from a donor substrate 1 with no risk of contamination of the material of the donor substrate 1 so as to make fracture independent of the differences in the coefficient of thermal expansion.

BRIEF SUMMARY

This disclosure aims to remedy some or all of the aforementioned drawbacks, and concerns a method of detaching a layer to be detached from a donor substrate comprising the following steps:

a) Assembling the donor substrate and a porous substrate, so that the porous substrate and the layer to be detached include a contact surface, the porous substrate including pores and crystallites; and
  b) Application to the assembly of a treatment of chemical modification of at least the surface of the crystallites contained in the porous substrate, the chemical modification being adapted to generate a variation of the volume of the crystallites, the volume variation generating a deformation in compression or in tension of the porous substrate essentially parallel to the contact surface, the deformation in compression or in tension of the porous substrate generating a stress in tension or in compression in the donor substrate, the stress in tension or in compression being greater than the mechanical strength of the donor substrate on a fracture plane essentially parallel to the contact surface and delimiting the layer to be detached, the stress leading to the detachment of the layer to be detached from the donor substrate along the fracture plane.

By "a porous substrate" is meant a substrate of a microstructured material comprising pores and crystallites. The pores constitute a void between the crystallites of the material. The "porosity of the material" is defined as the fraction of unoccupied volume (pores) within the material.

By "a fracture plane" is meant a plane included within the donor substrate, essentially parallel to the faces of the donor substrate, and delimiting the layer to be transferred from the donor substrate.

Accordingly, the chemical modification of at least the surface of the crystallites transforms the material of which the crystallites are composed into a material having a greater volume. This results in a modification of the volume and, therefore, a deformation of the porous substrate. The deformation in compression or in tension of the porous substrate enables generation of a stress at the level of the fracture plane delimiting the layer to be transferred. The stress is adjusted so as to be greater than the mechanical strength of the donor substrate, and a fracture occurs at the level of the fracture plane.

Moreover, it is possible to adjust the level of stress exerted by the porous substrate by way of its degree of porosity, its thickness or its stress before assembly. A given porous material then provides access to a wide range of thicknesses of the layer to be transferred.

Furthermore, fracture is independent of the difference between the coefficients of thermal expansion of the donor substrate and the porous substrate.

In one embodiment, the treatment is a heat treatment.

Accordingly, heat treatment enables generation of a deformation of the porous substrate by chemical modification of at least the surface of the crystallites. The deformation is essentially linked to the variation of the volume of the crystallites of the porous substrate, and induces a stress capable of initiating a fracture in the donor substrate.

Moreover, the difference between the coefficients of thermal expansion is not taken into account to generate the fracture and the donor substrate and the porous substrate may have the same chemical composition and, therefore, the same coefficient of thermal expansion.

In one embodiment, the heat treatment is a thermal oxidation treatment.

Accordingly, such a heat treatment enables deformation in tension of the porous substrate.

Applied to porous silicon, this treatment notably enables oxidation of the crystallites and increases their volume.

Moreover, the rate of oxidation of the crystallites enables modulation of the deformation of the porous substrate.

In one embodiment, the treatment is executed by the action of a chemical solution at a temperature below 100° C.

Accordingly, deformation in tension or in compression of the porous substrate can be effected without risk of damaging the layer to be transferred.

This chemical treatment is notably particularly advantageous when it is a question of transferring a layer to be transferred including species liable to diffuse because of the effect of an increase in temperature and/or including microelectronic devices.

In one embodiment, the chemical solution includes hydrofluoric acid and the porous substrate includes at least one of the materials selected from the following group: silicon, silicon carbide, and/or silicon germanium.

One embodiment includes a step a') executed before the step a) comprising deforming the porous substrate in tension or in compression.

Accordingly, the deformation of the porous substrate executed before the assembly step a) confers on the porous substrate a potential for deformation of greater amplitude during the step b). The resulting stress in the fracture plane is then higher.

In one embodiment, the donor substrate and the porous substrate have the same chemical composition.

Accordingly, the fracture is not disturbed by the differences in the coefficients of thermal expansion.

Moreover, the fact of considering materials with the same chemical composition limits contamination problems.

In one embodiment, a dielectric layer is formed on the porous substrate before step a).

Accordingly, after detachment of the layer to be detached, a silicon-on-insulator-type structure is obtained.

In one embodiment, the donor substrate and the porous substrate have the same chemical composition.

Moreover, the donor substrate and the porous substrate may be of the same kind. For example, the porous substrate and the donor substrate are both silicon substrates. Accordingly, there is no risk of metallic contamination.

Furthermore, fracture is not influenced by the differences in the coefficients of thermal expansion of the donor substrate and the porous substrate.

One embodiment includes a step a") executed before the step a) comprising weakening the fracture plane.

Accordingly, the step a") comprising weakening the fracture plane before assembly of the structure enables better control and better location of the fracture plane and, therefore, the thickness of the layer.

Furthermore, the weakening of the fracture plane enables consideration of a smaller deformation of the porous substrate during the step b).

In one embodiment, the step a") includes in series:
the implantation of atomic species in the fracture plane of the donor substrate, and
heat treatment at a temperature of the donor substrate below 400° C. in a reducing atmosphere.

BRIEF DESCRIPTION OF THE DRAWINGS

Other features and advantages will become apparent in the course of the following description of two embodiments of a transfer method in accordance with the disclosure, provided by way of nonlimiting example and given with reference to the appended drawings, in which.

DETAILED DESCRIPTION

For the various embodiments, the same references will be used for elements that are identical or provide the same function, with the purpose of simplification of the description.

Figure 1:
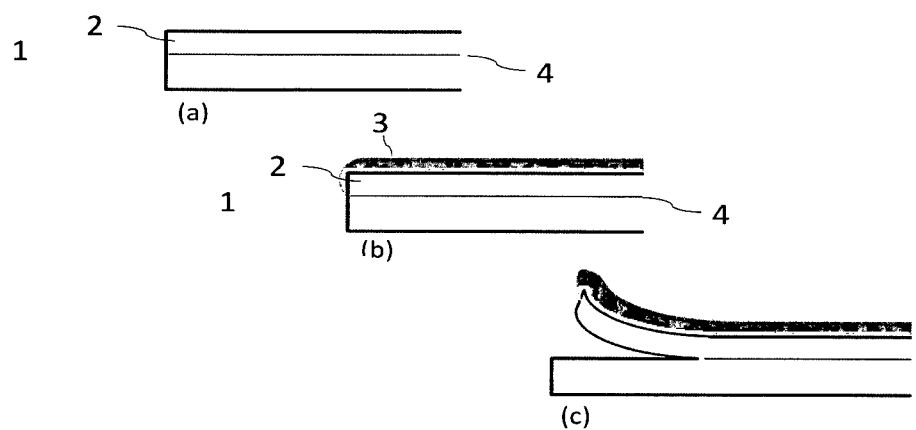
FIG. 1 is a diagrammatic representation of a detachment method employing known prior art techniques.
Figure 2:
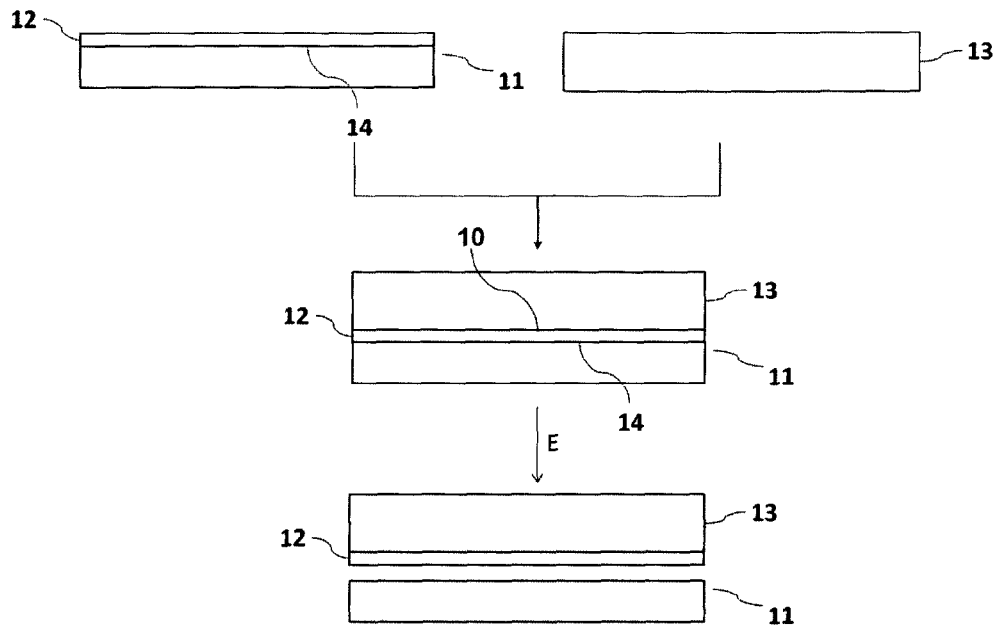
FIG. 2 is a diagrammatic representation of a detachment method employing the techniques of the disclosure.
Figure 3:
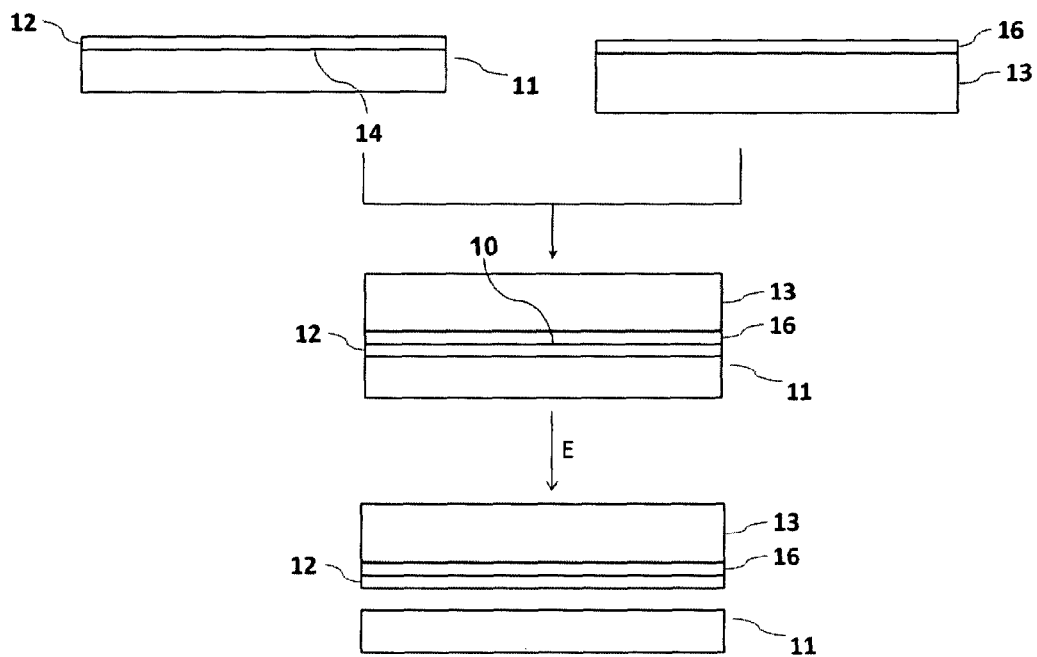
FIG. 3 is a diagrammatic representation of a detachment method employing the techniques of the disclosure.

The detachment method, shown in FIGS. 2 and 3, is a method of detaching a layer 12 to be detached from a donor substrate 11, comprising the following steps: a) assembling the donor substrate 11 and a porous substrate 13 so that the porous substrate 13 and the layer 12 to be detached include a contact surface 10, the porous substrate 13 including pores and crystallites, b) applying to the assembly a treatment E of chemical modification of at least the surface of the crystallites included in the porous substrate 13, the chemical modification being adapted to generate a variation of the volume of the crystallites, the volume variation generating deformation in compression or in tension of the porous substrate 13 essentially parallel to the contact surface 10, the deformation in compression or in tension of the porous substrate 13 generating a stress in tension or in compression in the donor substrate 11, the stress in tension or in compression being greater than the mechanical strength of the donor substrate 11 on a fracture plane 14 essentially parallel to the contact surface 10 and delimiting the layer 12 to be detached, the stress leading to the detachment of the layer 12 to be detached from the donor substrate 11 along the fracture plane 14.

The donor substrate 11 may be constituted of all materials usually employed in the micro-electronics, optics, opto-electronics and photovoltaic industry. The donor substrate 11 notably comprises at least one of the materials selected in the following group: silicon, silicon carbide, and/or silicon germanium.

In one particular embodiment, the layer 12 to be detached from the donor substrate 11 is an active layer formed of a plurality of superposed semiconductor materials and/or comprises electronic devices.

The devices are formed in or on the layer 12 to be detached before the assembly step a).

The porous substrate 13 may be constituted of all materials usually employed in the micro-electronics, optics, opto-electronics and photovoltaic industry. The porous substrate 13 notably comprises at least one of the materials selected in the following group: silicon, silicon carbide, and/or silicon germanium.

In a particularly advantageous manner, the donor substrate 11 and the porous substrate 13 have the same chemical composition.

The porosity of the material is defined as the fraction of unoccupied volume (pores) within the material. Other parameters may be used to characterize the porous layer (pore size, morphology, thickness, pore diameter, crystallite size, specific surface area, etc.).

For example, in the case where the material is silicon, it is a question of porous silicon, generally classed into three categories by a person skilled in the art:
macroporous silicon, generally obtained from type n silicon and weakly doped,
mesoporous silicon, generally obtained from highly doped $p^+$ silicon, and
nanoporous silicon, generally obtained from type p silicon, and weakly doped.

The porosity P of a porous semiconductor layer is defined as the fraction of unoccupied volume within the porous layer. It is written $$P = \frac{\rho - \rho_{Po}}{\rho},$$

where $\rho$ is the density of the non-porous material and $\rho_{Po}$ is the density of the porous material. It mostly varies between 10% and 90%.

The porous substrate 13 may be obtained in various ways.

The porous substrate 13 is advantageously obtained by a step of electrochemical anodization of a substrate 13'.

Figure 4:
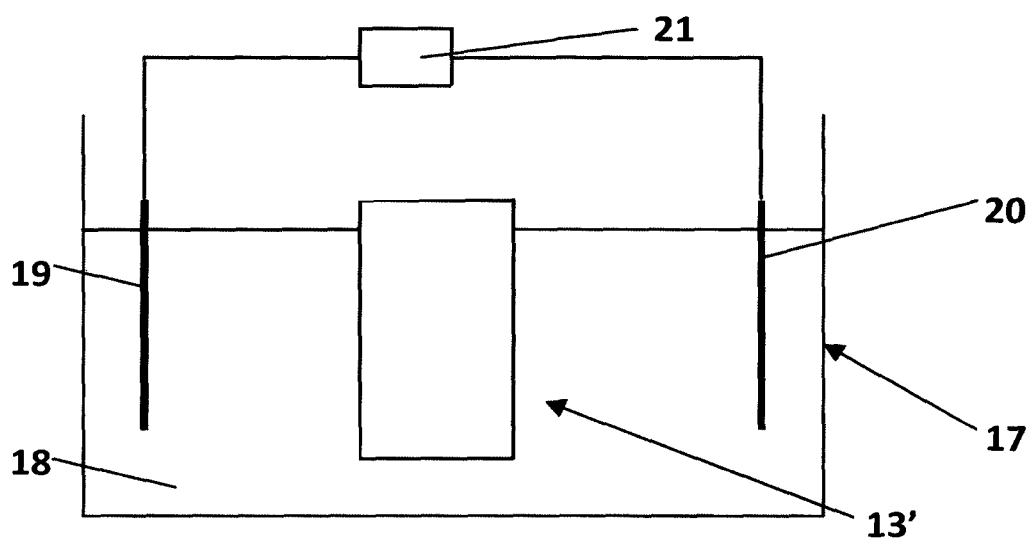
FIG. 4 is a diagrammatic representation of an electrochemical anodization method.

One embodiment of such electrochemical anodization is shown in FIG. 4.

The substrate 13' is placed in an enclosure 17 including an electrolyte 18.

The electrolyte 18 is, for example, a solution including hydrofluoric acid (HF).

An anode 19 and a cathode 20 immersed in the electrolyte 18 are connected to an electrical power supply 21.

An electrical current is applied between the anode 19 and the cathode 20 by the electrical power supply 21.

Another, complementary or alternative solution comprises adjusting the density of the electrical current applied by the electrical power supply 21.

The enclosure 17 is generally a TEFLON® tank.

Two electrodes 19 and 20, for example, made of platinum, constitute the anode and the cathode, and are connected to an electrical power supply 21.

Adjustment of the electrical current density and/or the appropriate choice of the doping of the substrate 13' enables a porous substrate 13 to be obtained.

At the end of anodization, the porous substrate 13 is rinsed.

In one particular embodiment of the disclosure, the porous substrate 13 may be deformed in tension or in compression during a step a'), before assembly, in order to generate a stress of greater amplitude during the step b).

In a particularly advantageous manner, the step a') includes thermal oxidation.

If the porous substrate 13 is porous silicon, the thermal oxidation may, for example, be effected at a temperature between 650° C. and 1100° C., in an oxidizing atmosphere in order to deform the porous substrate 13 in tension. During the step a') of thermal oxidation of the porous silicon, the silicon crystallites included in the porous silicon are oxidized at least at their surface. Silicon oxide being more bulky than silicon, the volume of the crystallites increases during the thermal oxidation step.

In a particularly advantageous manner, a dielectric layer 16 (see FIG. 3) is formed on the porous substrate 13 before the step a).

The dielectric layer 16 is advantageously formed by a deposition technique, preferably the CVD or LPCVD or PECVD technique.

The dielectric layer 16 includes at least one material chosen from the following materials: silicon oxide, silicon nitride or oxynitride, aluminium nitride, aluminium oxide, and/or hafnium oxide.

In a particularly advantageous manner, a step a") comprising weakening the fracture plane 14 is executed before the step a).

The step a") advantageously comprises the following steps:

implantation of atomic species in the fracture plane 14 of the donor substrate 11, and heat treatment of the donor substrate 11 at a temperature below 400° C. in a reducing atmosphere.

By way of nonlimiting example, the species implanted are hydrogen ions at a dosage below $5*10^{16}$ atoms/cm$^3$. During heat treatment at a temperature below 400° C. in a reducing atmosphere, however, the implanted ions create cavities that will coalesce without causing fracture in the fracture plane.

The step a) may be effected by molecular adhesion-type bonding or by anodic bonding.

The step a) is executed so as to bring the layer 12 to be transferred and the porous substrate 13 into contact along the surface 10.

The step a) may be preceded by any treatment of the porous substrate 13 and the donor substrate 11 aiming to strengthen the bonding energy such as cleaning or plasma activation.

In a particularly advantageous manner, the donor substrate 11 and the porous substrate 13 are subjected to a heat treatment including an increase in temperature after the step a).

Typical heat treatment temperatures are between 200° C. and 700° C., and preferably less than 400° C. in an inert atmosphere.

The function of this heat treatment is to strengthen the bonding energy between the donor substrate 11 and the porous substrate 13.

In an advantageous manner, the porous substrate 13 is deformed in compression or in tension during a treatment E. During the treatment E, the crystallites included in the porous substrate 13 vary in volume. Accordingly, the porous substrate 13 is deformed in compression or in tension. This deformation generates in the donor substrate 11 a stress that enables detachment of the layer 12 to be detached at the level of the fracture plane 14.

In a particularly advantageous manner, the treatment E is a heat treatment. Even more advantageously, this heat treatment includes a thermal oxidation treatment.

Thermal oxidation of a porous substrate 13 including porous silicon at temperatures between 200° C. and 800° C. in an oxidizing atmosphere notably enables deformation in tension of the porous substrate.

The chosen sizes of the crystallites, the porosity of the porous substrate 13 or the degree of oxidation are parameters that can be adjusted to impose a given stress on the donor substrate 11. Accordingly, the thickness of the layer 12 to be detached is determined by these adjustable parameters.

In a particularly advantageous manner, the treatment E is executed by the action of a chemical solution (see FIGS. 2 and 3) at a temperature below 100° C.

Accordingly, execution of the treatment E by the action of a chemical solution at a temperature below 100° C. enables a variation of the volume of the crystallites included in the porous substrate 13 to be brought about, without thermally damaging the layer 12 to be detached, however. This effect is particularly advantageous for a layer to be transferred including doping species liable to diffuse because of the effect of an increase in temperature or comprising micro-electronic devices.

In a particularly advantageous manner, the chemical solution includes hydrofluoric acid and the porous substrate 13 includes at least one of the materials selected in the following group: silicon, silicon carbide, and/or silicon germanium.

A porous substrate 13 including porous silicon thermally oxidized beforehand during a step a') may notably be deformed in compression by the action of a chemical solution including hydrofluoric acid. Hydrofluoric acid enables chemical etching of the silicon oxide formed at least at the surface of the silicon crystallites and thus reduction of the volume of the crystallites. The volume variation then induces deformation in compression of the porous substrate including silicon.

The disclosure notably enables transfer of semiconductor layers with a thickness that may vary from 0.1 to 100 µm.

Moreover, the disclosure enables the transfer of circuits formed on the layer to be detached to another substrate to be facilitated.

Finally, the disclosure applies to the transfer of numerous different useful layers, notably strained useful layers.

The invention claimed is:

1. A method of detaching a layer to be detached from a donor substrate, the method comprising:
    assembling the donor substrate and a porous substrate including the layer to be detached such that the porous substrate and the layer to be detached contact one another at an interface, the porous substrate including pores and crystallites; and
    after assembling the donor substrate and the porous substrate, applying a treatment to the assembly so as to chemically modify at least some surfaces of the crystallites of the porous substrate, the chemical modification generating a variation of a volume of the crystallites, the volume variation generating deformation in compression or in tension of the porous substrate essentially parallel to the interface, the deformation in compression or in tension of the porous substrate generating a stress in tension or in compression in the donor substrate, the stress in tension or in compression being greater than a mechanical strength of the donor substrate in a fracture plane essentially parallel to the interface and delimiting the layer to be detached, the stress leading to the detachment of the layer to be detached from the donor substrate along the fracture plane.

2. The method of claim 1, wherein the treatment is a heat treatment.

3. The method of claim 2, wherein the heat treatment is a thermal oxidation treatment.

4. The method of claim 3, further comprising deforming the porous substrate in tension or in compression prior to assembling the donor substrate and a porous substrate.

5. The method of claim 3, wherein the donor substrate and the porous substrate have the same chemical composition.

6. The method of claim 1, wherein the treatment is executed by the action of a chemical solution at a temperature below 100° C.

7. The method of claim 6, wherein the chemical solution includes hydrofluoric acid and the porous substrate includes at least one material selected from the group consisting of silicon, silicon carbide, and silicon germanium.

8. The method of claim 1, further comprising deforming the porous substrate in tension or in compression prior to assembling the donor substrate and a porous substrate.

9. The method of claim 8, wherein deforming the porous substrate comprises applying a thermal oxidation process to the porous substrate.

10. The method of claim 1, further comprising forming a dielectric layer on the porous substrate prior to assembling the donor substrate and the porous substrate.

11. The method of claim 1, wherein the donor substrate and the porous substrate have the same chemical composition.

12. The method of claim 1, further comprising weakening the fracture plane prior to assembling the donor substrate and the porous substrate.

13. The method of claim 12, wherein weakening the fracture plane comprises:
    implanting atomic species into the donor substrate along the fracture plane; and
    applying a heat treatment to the donor substrate at a temperature below 400° C. in a reducing atmosphere.

14. A method for fabricating a structure useful for subsequent manufacture of a micro-electronic device, an optical device, an opto-electronic device, or a photovoltaic device, the method comprising:
    bonding a donor substrate to a porous substrate along an interface, the porous substrate including pores and crystallites; and
    after bonding a donor substrate to a porous substrate along an interface, chemically modifying at least some of the crystallites so as to cause a volume of the crystallites to change resulting in the generation of compressive or tensile strain in the porous substrate and compressive or tensile stress in the donor substrate, the compressive or tensile stress in the donor substrate causing the donor substrate to fracture along a fracture plane so as to leave a layer of material of the donor substrate on the porous substrate, the layer of material being detached from a remainder of the donor substrate.

15. The method of claim 14, wherein chemically modifying at least some of the crystallites comprises thermally oxidizing at least some of the crystallites.

16. The method of claim 14, wherein chemically modifying at least some of the crystallites comprises exposing the at least some of the crystallites to a chemical solution at a temperature below 100° C.

17. The method of claim 16, further comprising selecting the chemical solution to include hydrofluoric acid, and selecting the porous substrate to include at least one material selected from the group consisting of silicon, silicon carbide, and silicon germanium.

18. The method of claim 14, further comprising deforming the porous substrate in tension or in compression prior to bonding the donor substrate to the porous substrate such that stress is present within the donor substrate prior to chemically modifying at least some of the crystallites so as to cause a volume of the crystallites to change resulting in the generation of compressive or tensile strain in the porous substrate and compressive or tensile stress in the donor substrate.

19. The method of claim 14, further comprising forming a dielectric layer on the porous substrate prior to bonding the donor substrate to the porous substrate such that the dielectric layer is disposed between the donor substrate and the porous substrate.

20. The method of claim 14, further comprising weakening the fracture plane prior to bonding the donor substrate to the porous substrate, weakening the fracture plane comprising:
    implanting atomic species into the donor substrate along the fracture plane; and
    applying a heat treatment to the donor substrate at a temperature below 400° C. in a reducing atmosphere.

* * * * *